US011988795B2

(12) United States Patent
Zeghlache (10) Patent No.: US 11,988,795 B2
(45) Date of Patent: May 21, 2024

(54) AUTOMATED WELL LOG DATA QUICKLOOK ANALYSIS AND INTERPRETATION (71) Applicant: SAUDI ARABIAN OIL COMPANY, Dhahran (SA)

(72) Inventor: Mohamed Larbi Zeghlache, Al Khubar (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 140 days.

(21) Appl. No.: 17/463,122

(22) Filed: Aug. 31, 2021

(65) Prior Publication Data
US 2023/0063424 A1 Mar. 2, 2023

(51) Int. Cl.
G01V 20/00 (2024.01)
G06N 3/02 (2006.01)
G06N 20/20 (2019.01)

(52) U.S. Cl.
CPC ............... *G01V 20/00* (2024.01); *G06N 3/02* (2013.01); *G06N 20/20* (2019.01)

(58) Field of Classification Search
CPC ......... G01V 99/005; G06N 3/02; G06N 20/20
See application file for complete search history.

(56) References Cited

U.S. PATENT DOCUMENTS 4,393,486 A * 7/1983 Thompson ............... G01V 1/50
367/75
8,505,625 B2 * 8/2013 Ravi ........................ E21B 33/14
166/250.14

(Continued)

FOREIGN PATENT DOCUMENTS

CN 106918847 A 7/2017
CN 104881435 B 5/2018
(Continued)

OTHER PUBLICATIONS

Esrafili-Dizaji, Quick look log analysis, Sep. 2021, Researchgate. net, p. 1, https://www.researchgate.net/publication/354378960_Quick_look_log_analysis (Year: 2021).*

(Continued)

*Primary Examiner* — Mischita L Henson
(74) *Attorney, Agent, or Firm* — Osha Bergman Watanabe & Burton LLP (57) ABSTRACT

A method for well log data interpretation includes obtaining well data by a well log interpreter and determining, automatically by the well log interpreter, a plurality of machine-learning models corresponding to the well data based on a plurality of well data type. Additionally, the method includes determining, by the well log interpreter and in real-time, preview data regarding a well operation using the machine-learning models, and transmitting, by the well log interpreter to a user device, an interpretation report comprising the preview data. A system for well log data interpretation includes a logging system coupled to a plurality of logging tools, a logging system coupled to a plurality of logging tools, a drilling system coupled to the logging system, and a well log interpreter comprising a computer processor. The well log interpreter is coupled to the logging system and the drilling system. The well log interpreter comprising functionality for performing the well log data interpretation method.

17 Claims, 5 Drawing Sheets

(56) References Cited

U.S. PATENT DOCUMENTS

| | | | |
|---|---|---|---|
| 9,939,548 B2 | 4/2018 | Burmester et al. | |
| 2009/0037111 A1* | 2/2009 | Radtke | G01V 11/00 |
| | | | 702/11 |
| 2018/0348395 A1* | 12/2018 | Wilson | G01V 3/32 |
| 2019/0034812 A1* | 1/2019 | Borrel | G01V 99/005 |
| 2019/0064383 A1* | 2/2019 | Song | G01V 3/26 |
| 2022/0043179 A1* | 2/2022 | Ghosh | G01V 5/12 |
| 2023/0041525 A1* | 2/2023 | Hong | G06N 20/20 |

FOREIGN PATENT DOCUMENTS

| | | | | |
|---|---|---|---|---|
| CN | 111472751 B | 11/2020 | | |
| WO | WO-2013122971 A2 * | 8/2013 | ............ | E21B 43/26 |
| WO | 2018/182691 A1 | 10/2018 | | |
| WO | 2018/208634 A1 | 11/2018 | | |
| WO | 2019/241062 A1 | 12/2019 | | |

OTHER PUBLICATIONS

T. Cornet et al, BepiColombo Data Analysis Ecosystem: Quick-Look and Science Analysis Forum, 2021, USRA-Houston, p. 1, https://www.hou.usra.edu/meetings/planetdata2021/eposter/7033.pdf (Year: 2021).*

Wu, Po-Yen et al., "Machine learning-based method for automated well log processing and interpretation"; SEG Technical Program Expanded Abstracts 2018; pp. 2041-2045; Aug. 27, 2018 (5 pages).

Singh, Harpreet et al., "Automated Well-Log Processing and Lithology Classification by Identifying Optimal Features Through Unsupervised and Supervised Machine-Learning Algorithms"; SPE Journal; vol. 25, Issue 5, Paper No. SPE-202477-PA; pp. 1-23; Oct. 2020 (23 pages).

Oberwinker, Christian et al., "Automated Production Surveillance"; SPE Projects, Facilities & Construction; vol. 1, Issue 2, Paper No. SPE-96645-PA; pp. 1-8; Jun. 2006 (8 pages).

Xu, Chicheng et al., "When Petrophysics Meets Big Data: What can Machine Do?"; Proceedings of the SPE Middle East Oil and Gas Show and Conference; Paper No. SPE-195068-MS; pp. 1-25; Mar. 18-21, 2019 (25 pages).

Pankaj, Purohit et al., "Preserving and Securing Legacy Well Log Data"; Proceedings of the Abu Dhabi International Petroleum Exhibition & Conference; Paper No. SPE-188475-MS; pp. 1-13; Nov. 13-16, 2017 (13 pages).

Le Nir, I. et al., "Cross-Section Construction From Automated Well Log Correlation: A Dynamic Programming Approach Using Multiple Well Logs"; Proceedings of the SPWLA 39th Annual Logging Symposium; Paper No. SPWLA-1998-DDD; pp. 1-13; May 26-28, 1998 (13 pages).

Viggen, Erlend Magnus et al., "Automatic interpretation of cement evaluation logs from cased boreholes using supervised deep neural networks"; Journal of Petroleum Science and Engineering; vol. 195, Article 107539; pp. 1-17; Dec. 2020 (17 pages).

* cited by examiner

AUTOMATED WELL LOG DATA QUICKLOOK ANALYSIS AND INTERPRETATION

BACKGROUND

In the oil and gas industry, wells are drilled for exploration, development, and production purposes. A lot of money is being spent in oil and gas industry to collect data that is vital to the management and optimization of assets. One of the most complex and diverse data is well data where sensors are deployed at surface or in downhole conditions to collect real-time or memory data, in rig and rigless locations, in onshore and offshore environments.

Turnaround time versus quality is a critical tradeoff across all disciplines of the oil and gas industry. Specifically, the quality of the product does not specifically refer to the quality of each element of the product. The quality in this context may refer at least to completeness, comprehensiveness, and robustness. The notions of quicklook, rush processing, or field interpretation were introduced to designate a quick answer due to limited time and resources once data acquisition is completed. Limitations differ from one location to another, and depend on logging systems, data transmission capabilities, expertise availability to handle the transmitted data, the validity and accuracy of the acquired data, the complexity of the data, and interpretation models.

SUMMARY

In general, in one aspect, the invention relates to a method. The method comprises obtaining, by a well log interpreter and over a well network from a plurality of logging tools or any other well sensing and surveillance techniques, well data regarding a well, wherein the well data comprises image log data, waveform log data, scalar log data, logging tool data, and a plurality of logging tool parameters, determining, automatically by the well log interpreter, a plurality of machine-learning models corresponding to the well data based on a plurality of well data types, determining, by the well log interpreter and in real-time with obtaining the well log data from the plurality of logging tools, preview data regarding a well operation using the machine-learning models and the well log data, and transmitting, by the well log interpreter and to a user device, an interpretation report comprising the preview data, both in real-time and offline modes.

In general, in one aspect, the invention relates to a system. The system comprising a logging system coupled to a plurality of logging tools, a drilling/completion system coupled to the logging system, and a well log interpreter comprising a computer processor, wherein the well log interpreter is coupled to the logging system and the drilling/completion system, the well log interpreter comprising functionality for obtaining log data regarding a geological region of interest, obtaining well log data from a wellbore within the geological region of interest, and determining a plurality of machine-learning models corresponding to the well data based on a plurality of well data types, determining, in real-time with obtaining the well log data from the plurality of logging tools, preview data regarding a well operation using the machine-learning models and the well log data, and transmitting, to a user device, an interpretation report comprising the preview data.

BRIEF DESCRIPTION OF DRAWINGS

Specific embodiments disclosed herein will now be described in detail with reference to the accompanying figures. Like elements in the various figures are denoted by like reference numerals for consistency. Like elements may not be labeled in all figures for the sake of simplicity.

DETAILED DESCRIPTION

In the following detailed description of embodiments disclosed herein, numerous specific details are set forth in order to provide a more thorough understanding disclosed herein. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-6, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

Embodiments disclosed herein provide a method and a system for well log data quicklook analysis and interpretation. Data interpretation is a process of reviewing data through a predefined set of actions. The purpose of the data interpretation is assigning a meaning to the data and drawing relevant conclusions. Specifically, data is a collection of facts in unorganized form, such as numbers. Cleaned and preprocessed data is called information and a set of information analyzed to have a meaning within a context is a knowledge. More specifically, this disclosure introduces automating the interpretation of well log data, from the raw data to the knowledge, using artificial intelligence (AI).

A technical advantage of the proposed disclosure introduces the automated well data interpretation with a plurality of sophisticated capabilities and features. This disclosure systematically tackles the issue of interpreting data in an automatic and rapid manner, covering all types of log measurements. Specifically, the automated interpretation system includes at least a logging module, a quality control module, a machine learning module, and a quicklook interpretation reporting module. These modules are discussed further in FIGS. 2 and 3.

Figure 1:
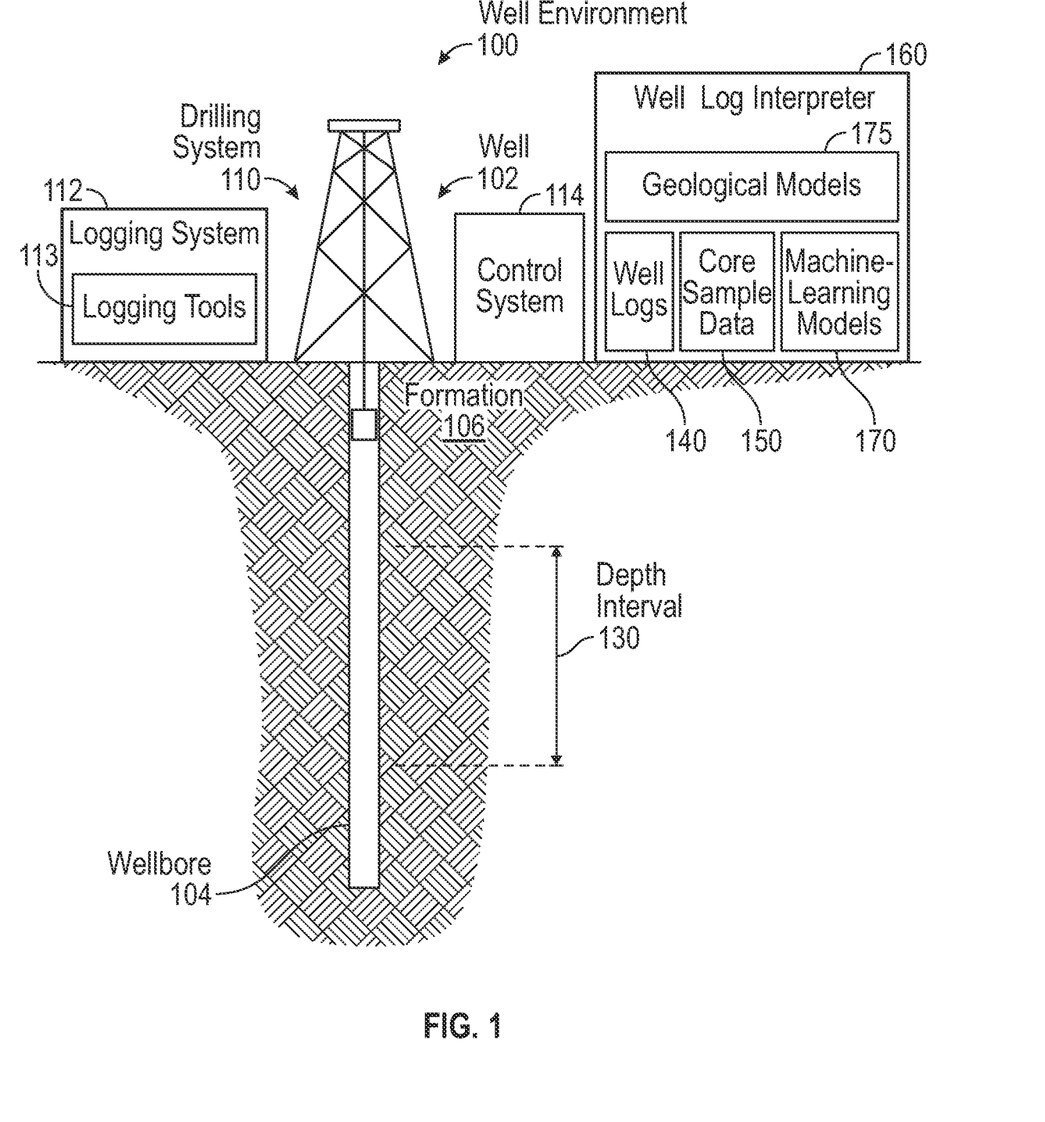
FIG. 1 shows a system in accordance with one or more embodiments.

Turning to FIG. 1, FIG. 1 shows a schematic diagram in accordance with one or more embodiments. As shown in FIG. 1, FIG. 1 illustrates a well environment (100) that may include a well (102) having a wellbore (104) extending into a formation (106). The wellbore (104) may include a bored hole that extends from the surface into a target zone of the formation (106), such as a reservoir. The formation (106) may include various formation characteristics of interest, such as formation porosity, formation permeability, resistivity, density, water saturation, and the like. Porosity may indicate how much space exists in a particular rock within an area of interest in the formation (106), where oil, gas, and/or water may be trapped. Permeability may indicate the ability of liquids and gases to flow through the rock within the area of interest. Resistivity may indicate how strongly rock and/or fluid within the formation (106) opposes the flow of electrical current. For example, resistivity may be indicative of the porosity of the formation (106) and the presence of hydrocarbons. More specifically, resistivity may be relatively low for a formation that has high porosity and a large amount of water, and resistivity may be relatively high for a formation that has low porosity or includes a large amount of hydrocarbons. Water saturation may indicate the fraction of water in a given pore space.

Keeping with FIG. 1, the well environment (100) may include a drilling system (110), a logging system (112), a control system (114), and a well log interpreter (160). The environment may include at least the open hole evaluation, cased hole evaluation, or the surface sensing. The drilling system (110) may include a drill string, drill bit, a mud circulation system and/or the like for use in boring the wellbore (104) into the formation (106). The control system (114) may include hardware and/or software for managing drilling operations and/or maintenance operations. For example, the control system (114) may include one or more programmable logic controllers (PLCs) that include hardware and/or software with functionality to control one or more processes performed by the drilling system (110). Specifically, a programmable logic controller may control valve states, fluid levels, pipe pressures, warning alarms, and/or pressure releases throughout a drilling rig. In particular, a programmable logic controller may be a ruggedized computer system with functionality to withstand vibrations, extreme temperatures, wet conditions, and/or dusty conditions, for example, around a drilling rig. Without loss of generality, the term "control system" may refer to a drilling operation control system that is used to operate and control the equipment, a drilling data acquisition and monitoring system that is used to acquire drilling process and equipment data and to monitor the operation of the drilling process, or a drilling interpretation software system that is used to analyze and understand drilling events and progress.

Turning to a well log interpreter (160), the well log interpreter (160) may include hardware and/or software with functionality for storing and analyzing well logs (140), core sample data (150), seismic data, and/or other types of data to generate and/or update one or more geological models (175). Geological models may include geochemical or geomechanical models that describe structural relationships within a particular geological region. While the well log interpreter (160) is shown at a well site, in some embodiments, the well log interpreter (160) may be remote from a well site. In some embodiments, the well log interpreter (160) is implemented as part of a software platform for the control system (114). The software platform may obtain data acquired by the drilling system (110) and logging system (112) as inputs, which may include multiple data types from multiple sources. The software platform may aggregate the data from these systems (110, 112) in real time for rapid analysis. In some embodiments, the control system (114), the logging system (112), and/or the well log interpreter (160) may include a computer system that is similar to the computer system (600) described below with regard to FIG. 6 and the accompanying description.

The logging system (112) may include one or more logging tools (113), such as a nuclear magnetic resonance (NMR) logging tool and/or a resistivity logging tool, for use in generating well logs (140) of the formation (106). For example, a logging tool may be lowered into the wellbore (104) to acquire measurements as the tool traverses a depth interval (130) (e.g., a targeted reservoir section) of the wellbore (104). The plot of the logging measurements versus depth may be referred to as a "log" or "well log". Well logs (104) may provide depth measurements of the well (102) that describe such reservoir characteristics as formation porosity, formation permeability, resistivity, density, water saturation, and the like. The resulting logging measurements may be stored and/or processed, for example, by the control system (114), to generate corresponding well logs (140) for the well (102). A well log may include, for example, a plot of a logging response time versus true vertical depth (TVD) across the depth interval (130) of the wellbore (104).

Figure 2:
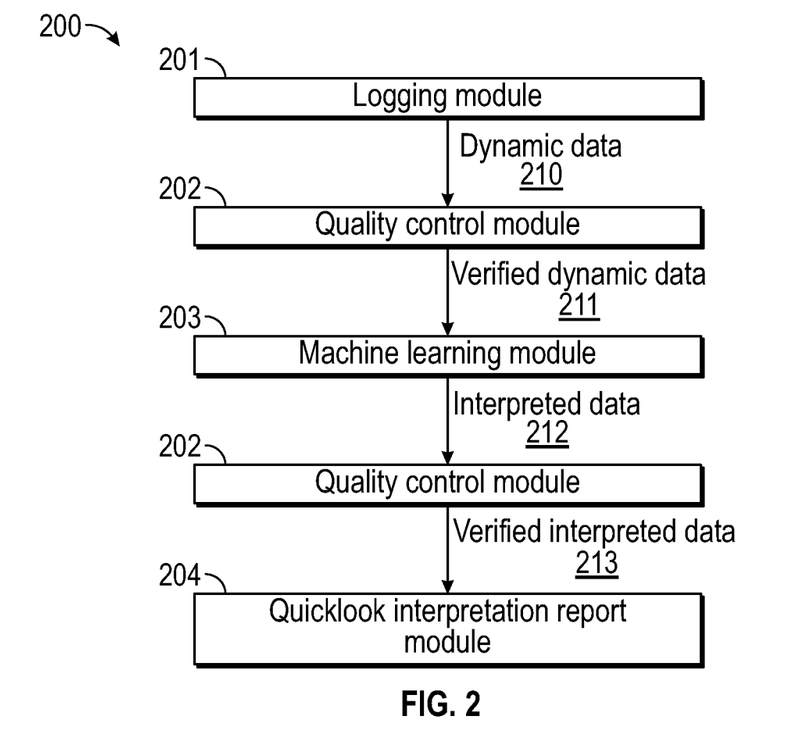
FIG. 2 shows a flowchart of quicklook interpretation stages in accordance with one or more embodiments.

In some embodiments, the well log interpreter (160) collects and records well logs (140) for the well environment (10). A logging module (201), as depicted in FIG. 2, may generate datasets of dynamic data (210) based on the collected well data. Further, dynamic logging module (201), quality control module (202), machine learning module (203), and quicklook interpretation report module (204) depicted in FIG. 2 may be part of the well log interpreter (160) that includes hardware and/or software with functionality for analyzing well log data.

More specifically, in one or more embodiments, FIG. 2 depicts an automated well interpretation system (200) comprising a logging module (201), a quality control module (202), a machine learning module (203) and a quicklook interpretation report module (204). In one or more embodiments, the interpretation system (200) analyzes well log data to determine a corresponding machine-learning module and generated a preview data on a well operation based on the machine-learning module. The automated well interpretation system (200) may be equipped with multiple modules (202-206) that perform quality control and analysis tasks. The modules of the checkpoint system (200) described below may be implemented as hardware, software, firmware, or any combination thereof.

In some embodiments, initial parameters used for the well log data quicklook interpretation are based on dynamic data (210). The dynamic data (210) is continuously collected by the logging module (201) and represents real-time data coming directly from the rig or wellbore (120). It may be received as real-time streaming data or play-back of static data. The dynamic data (210) is reused and updated frequently and that minimizes the necessity for storing huge amounts of data. However, unlike the static data, that may be analyzed only once, the dynamic data (210) must be analyzed repeatedly, as it frequently changes. Hence, the automated interpretation system (200) is a preferable process to manual analysis.

Further, the logging module (201) may obtain data from various tools/systems for sensing and/or measuring, such as an impulse hammer geomechanical probe, a hyperspectral and Fourier transform spectrometer, a NMR spectrometer, an acoustic transducer, and a resistivity logging. For example, the logging module (201) may obtain data from a logging tool, used for acquiring logging measurements, that is lowered into the wellbore (120) and/or used in the laboratory to acquire measurements as the tool traverses through the wellbore (120). The obtained data may be formatted as a single compressed file that contains large quantities of log files or individual log files in at least one of DLIS, LAS, image or main log formats.

As mentioned above, the data loading module (201) obtains data in a variety of formats. Specifically, the data loading module (201) is configured to format the received data into a singular format to maintain consistency throughout the analytical process. In one or more embodiments, the formatted dynamic data (210) is exported by the data loading module (201) to the quality control module (202).

Continuing with FIG. 2, the quality control (QC) module (202) receives the formatted dynamic data (210) from the data loading module (201). The quality control module (202) initially checks the obtained formatted data from the data loading module (201) against the sensor specification and manufacturer guidelines. In addition, in one or more embodiments, quality control module (202) feeds the machine learning module (203) with verified dynamic data (211) for further AI analysis and interpretation.

Figure 3:
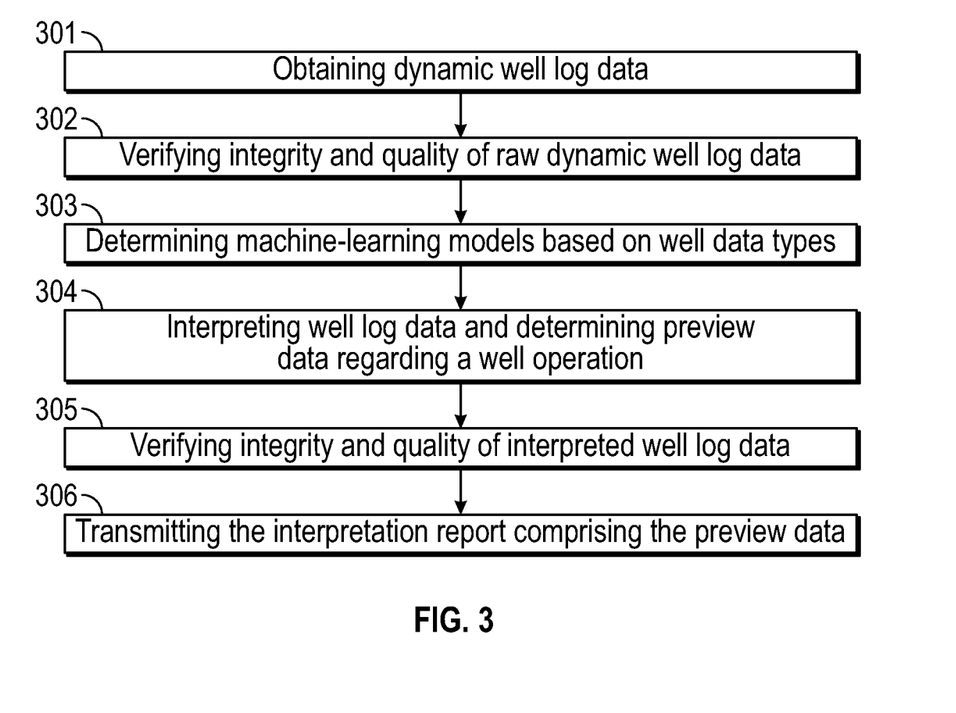
FIGS. 3-5 shows process flowcharts in accordance with one or more embodiments.

As shown in FIG. 3, the formatted dynamic data (210) is verified for corresponding data structures to ensure at least that there is no discrepancy between data type and data units of the same petrophysical or geomechanical property (e.g., porosity, water saturation, unconstrained sonic velocities, near-surface gas permeability, etc.). The potential discrepancies of the acquisition parameters may be caused due to the issues with sensors and logging tools. Quality control module (202) at least looks for human error, transfer error, viruses and malicious data. At this step, all irregularities are categorized and noted in the interpretation report. Quality control module (202) also performs basic and advanced quality check based on the learned data patterns and known environment responses.

Continuing with FIG. 2, the machine learning (ML) module (203) receives the verified dynamic data (211) from the quality control module (202). The ML module (203) analyzes the verified dynamic data (211) and sends results of the analysis, organized as the interpreted data (212) to the quality control module (202), for additional verification. In addition, in one or more embodiments, the instructions and parameters to the machine learning module (205) for further AI analysis of data errors may be preconfigured or they may be based on results received from logging module.

As shown in FIG. 3, the ML module (203) performs advance analysis of verified dynamic data (211). ML module (203) performs smart interpretation of data at the wellsite location by proper selection of parameters and models. In addition, advanced ML algorithms are used to learn the rationales behind specific interpretation techniques and apply best fit models based on the collected data and the environment conditions, such as surface and downhole parameters. ML module (203) deploys the advances in machine learning algorithm in order to automate data quality control and interpretation by selecting the best fit models/parameters and interpretation techniques.

Further, the statistical analysis explores relations between the datasets, organizes and describes anomalies and threats. The statistical analysis provides processed information as at least in a form of a log track, a histogram, and a pie chart, and color coded with the validation output types, including keys, units, upper and lower bounds of values, the mean. Statistical analysis may create a visualization of a data channel in a log track, a histogram, and a pie chart, with the highlighted validation output types. In addition, in one or more embodiments, ML module (203) feeds the quality control module (202) with interpreted data (212) for further verification of interpreted data (212).

Predictive analysis relies on decision analysis, transactional profiling, and predictive modeling to analyze the anomalies and threats. The predictive analysis uses historical data and results of the statistical analysis to predict future anomalies and threats. Additionally, the predictive analysis may generate interpretation curves and compare them with calibration data or standard responses of the well log data. Specifically, for example, the interpretation curves may show a calculated cumulative thickness from the provided individual thicknesses, and a comparison of this data to the total thickness curve. In another embodiment, the interpretation curves may represent a calculation of a data channel frequency, mean and standard deviation, that is compared with a reference distribution response. The interpretation curves may be used to optimize future work and issue early warnings in the quicklook interpretation report. The prescriptive analysis goes beyond predicting options and suggests a range of data quality controls that need to be implemented to overcome violations and reduce anomalies and threats. Employing the predictive and the prescriptive analysis provides an insight in the potential future trends and options and suggests actions to achieve desired goals.

Continuing with FIG. 2, the quality control (QC) module (202) receives the interpreted data (212) from the ML module (203). The quality control module (202) initially checks the obtained formatted data from the data loading module (201) against the interpretation guidelines, predicted logs, offset well data, etc. In addition, in one or more embodiments, quality control module (202) feeds the quicklook interpretation report module (204) with verified interpreted data (211).

Turning to FIG. 3, FIG. 3 shows a flowchart in accordance with one or more embodiments. Specifically, FIG. 3 describes a general method for automating well log interpretation using machine learning. One or more blocks in FIG. 3 may be performed by one or more components (e.g., well data interpreter (160)) as described in FIGS. 1 and/or 2. While the various blocks in FIG. 3 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 300, well log data are obtained for a geological region of interest in accordance with one or more embodiments. A geological region of interest may be a portion of a geological area or volume that includes one or more formations of interest desired or selected for analysis, e.g., for determining location of hydrocarbons or reservoir development purposes.

In Block 301, well log data are obtained for a geological region of interest in accordance with one or more embodiments. For example, well log data may be obtained from various databases, preprocessed, and/or augmented to serve as training data for a machine-learning model or as input data for well log interpretation. In some embodiments, the well log data may be similar to the well logs (140) described above in FIG. 1 and the accompanying description. Additionally, well log data may be obtained as described in the logging module (201).

In Block 302, received well log data is verified for its integrity and quality. The well log data may be processed by a plurality of quality control processes that check the loaded data versus the input reference and predetermined controls. The quality control processes include at least verifying data structure module, verifying data integrity, verifying data quality, verifying data compliance, verifying data accuracy, and verifying data repeatability.

Specifically, the well log data is verified for corresponding data structures to ensure at least that there is no discrepancy between data type and data units of the same petrophysical or geomechanical property (e.g., porosity, water saturation, unconstrained sonic velocities, near-surface gas permeability, etc.). Verifying the integrity of the well log data involves testing data for recoverability, searchability, traceability, and connectivity. This process at least looks for human error, transfer error, viruses and malicious data. Additionally, quality of data is verified to ensure reliability of a dataset. Verification of data compliance ensures at least that sensitive data is organized in a way to meet organization or government rules and legal regulations. Further, this process regulates security policy to prevent security incidents regarding the stored and analyzed data. Verification of data accuracy ensures that the data values are correct and represented in a consistent and unambiguous form. Finally, verifying data repeatability ensures that various tests on the same dataset will result with the same result. In addition, in one or more embodiments, block 302 feeds the machine learning algorithms with input for further AI analysis of data errors and violations.

In Block 303, the well log data is analyzed to determine the corresponding machine-learning model. Specifically, an input sequence may be generated for a machine-learning model using well log data in accordance with one or more embodiments. More specifically, the input sequence may correspond to a series of features in a time series vector. Likewise, some embodiments use multiple feature vectors as inputs to a machine-learning model. Given a single point within a well, for example, several measurements may be obtained for the same point, e.g., using gamma ray measurements, density measurements, resistivity measurements, and/or seismic measurements. Thus, well log data may be converted to one or more input sequences for mapping input features to a geological time event sequence. As such, a machine-learning model may use all or multiple points in an input sequence to determine a full context of a particular point or location. For example, deep machine learning may use temporal data before and after a respective point in the input sequence in order to determine a corresponding class for a feature in an output sequence.

In some embodiments, the machine-learning model is a deep neural network that includes multiple dilated layers. For example, a dilated layer may be a convolutional layer that includes a dilation factor. In some embodiments, the machine-learning model is a model with multiple input streams such as convolutional and recurrent streams that are concatenated at a final hidden layer. In some embodiments, the machine-learning model is a temporal convolutional network with multiple dilated layers with different dilation factors.

Block 304, the automated interpretation report of well log is generated. Specifically, the advanced ML algorithms are used to automate data quality control and interpretation by selecting the best fit models/parameters and interpretation techniques. The automated interpretation report includes, at least, the analysis of the obtained formatted data from the data loading module against the sensor specification and manufacturer guidelines, reservoir characteristic such as formation porosity, formation permeability, resistivity, density, water saturation, real-time recommendations to repeat the data, replace sensor, replace tools, etc.

In Block 305, received interpreted data is verified for its integrity and quality. The interpreted data may be processed by a plurality of quality control processes that check the loaded data versus the input reference and predetermined controls, similarly to well log data quality control described in Block 302.

Finally, In Block 306, the interpretation report comprising the preview data is transmitted to stakeholders. More specifically, in one or more embodiments, the reports generated by the well log interpreter include a report to the user with interpretation results, and real-time recommendations on how to improve the well environment (100) or the processes occurring in it. The well log interpreter may also generate prescriptive analytics to improve controls of the well environment (200).

Figure 4:
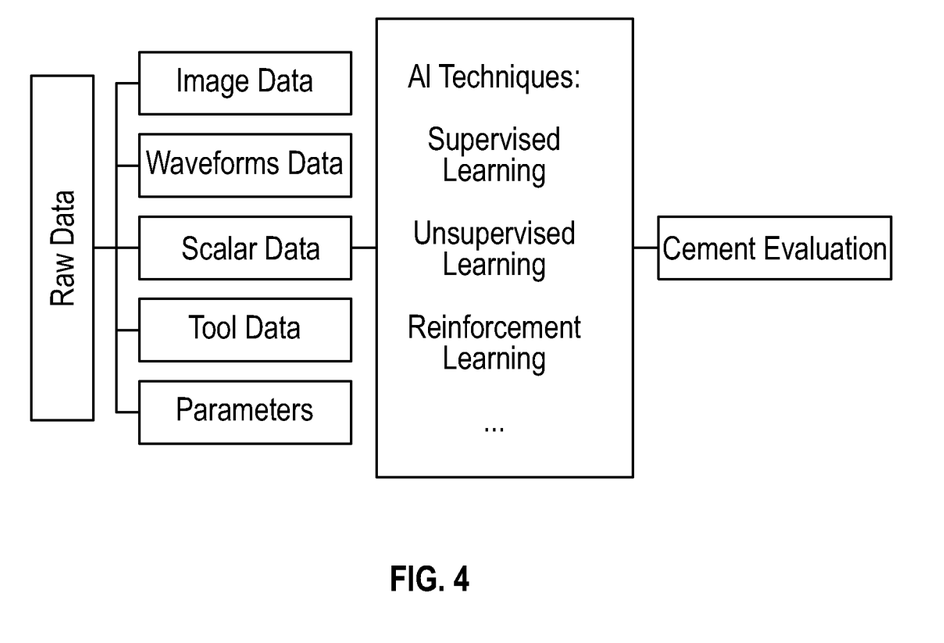
Figure 5:
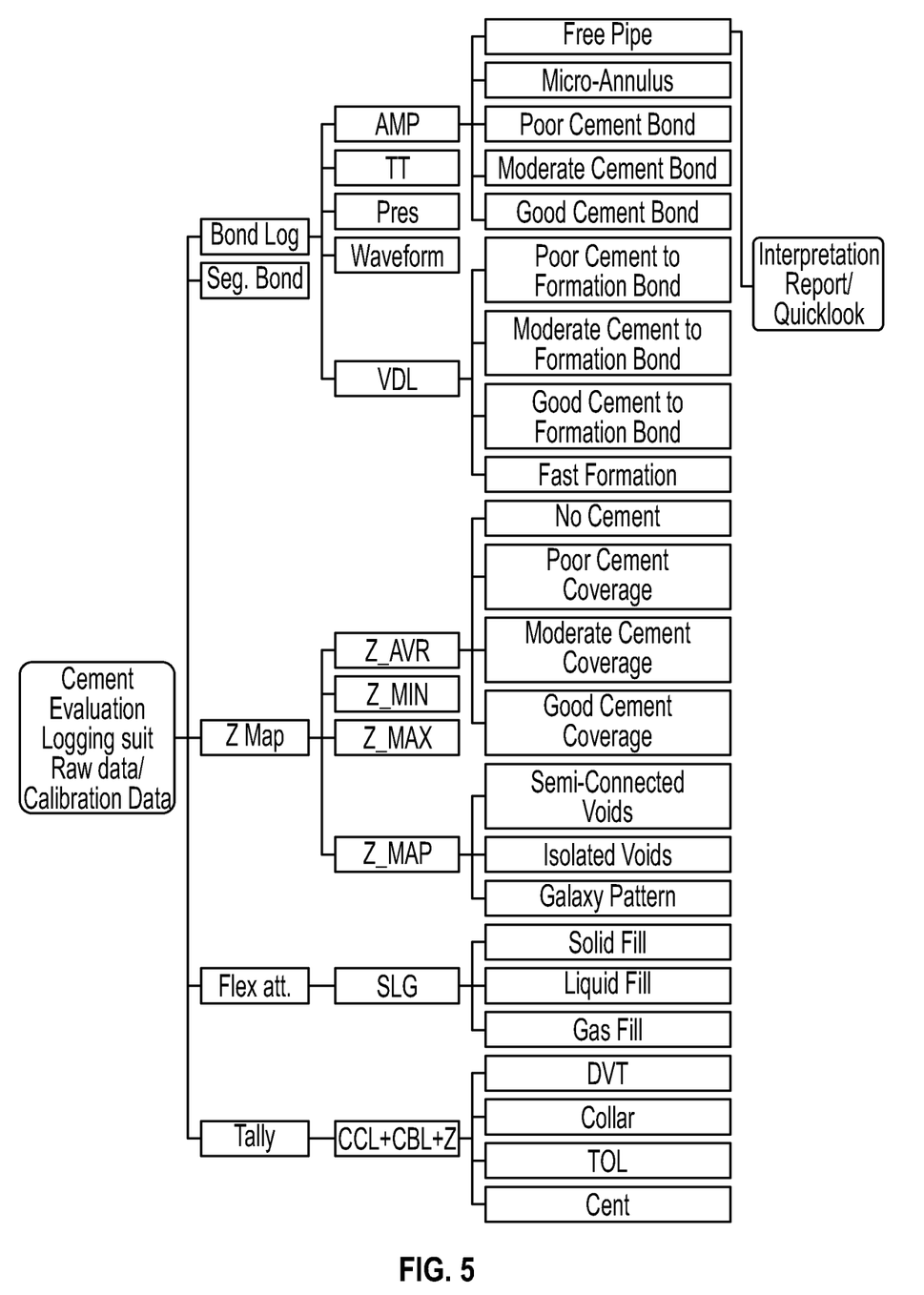

Turning to FIGS. 4 and 5, FIGS. 4 and 5 provide an example of evaluating cement in accordance with one or more embodiments. The following examples are for explanatory purposes only and not intended to limit the scope of the disclosed technology. In FIG. 4, FIG. 4 shows a process of determining corresponding machine-learning models for a plurality of different data types. A plurality of data types includes, but is not limited to, image data, waveform data, scalar data, tool data, and other parameters.

Keeping with FIG. 4, the image data may be analyzed using convolutional neural networks, which assigns learnable weights and biases to various properties of the image data and classifies image data as such. Additionally, recurrent neural networks may be used to analyze waveforms. Specifically, the recurrent neural networks base their outputs on the supplied input as well as the prior inputs and results, which is suitable for analyzing waveforms. Additionally, Random Forrest and Support-Vector machines may be used for solving classification and regression challenges.

Figure 6:
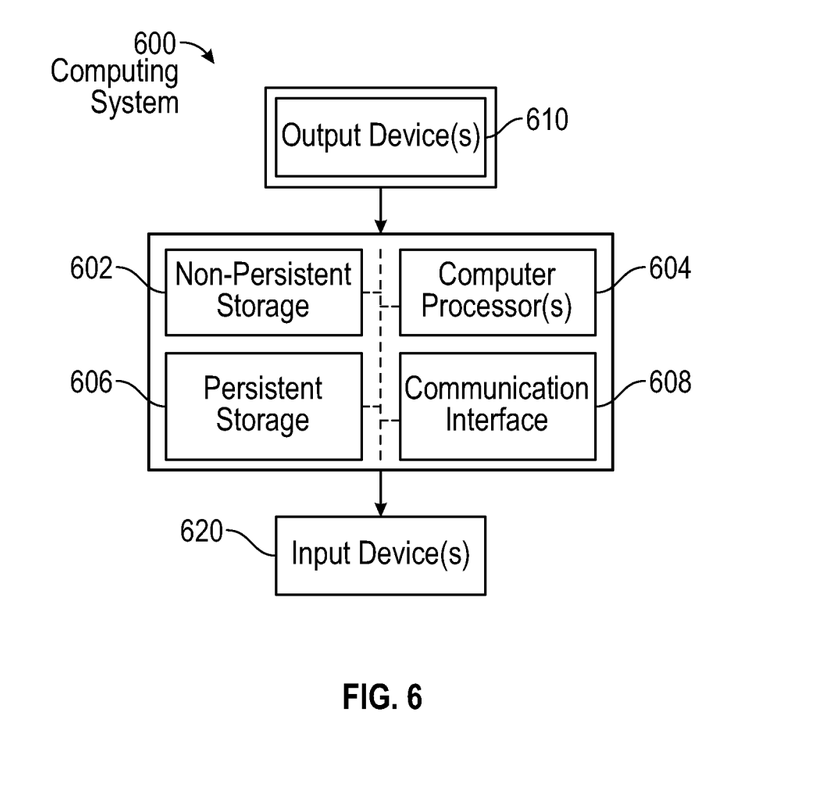
FIG. 6 shows a computer system in accordance with one or more embodiments.

Embodiments may be implemented on a computing system. Any combination of mobile, desktop, server, router, switch, embedded device, or other types of hardware may be used. For example, as shown in FIG. 6, the computing system (600) may include one or more computer processors (604), non-persistent storage (602) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (608) (e.g., Bluetooth interface, infrared interface, network interface, optical interface, etc.), and numerous other elements and functionalities.

The computer processor(s) (604) may be an integrated circuit for processing instructions. For example, the computer processor(s) may be one or more cores or micro-cores of a processor. The computing system (600) may also include one or more input devices (620), such as a touchscreen, keyboard, mouse, microphone, touchpad, electronic pen, or any other type of input device.

The communication interface (608) may include an integrated circuit for connecting the computing system (600) to a network (not shown) (e.g., a local area network (LAN), a wide area network (WAN) such as the Internet, mobile network, or any other type of network) and/or to another device, such as another computing device.

Further, the computing system (600) may include one or more output devices (610), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (604), non-persistent storage (602), and persistent storage (606). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

While the disclosure has been described with respect to a limited number of embodiments, those skilled in the art, having benefit of this disclosure, will appreciate that other embodiments may be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A method, comprising:
   obtaining, by a well log interpreter and over a well network from a plurality of logging tools, well data regarding a well, wherein the well data comprises image log data, waveform log data, scalar log data, logging tool data, and a plurality of logging tool parameters;
   determining, automatically by the well log interpreter, a plurality of machine-learning models corresponding to the well data based on a plurality of well data types;
   determining, by the well log interpreter and in real-time with obtaining the well log data from the plurality of logging tools, preview data regarding a well operation using the machine-learning models and the well log data;
   transmitting, by the well log interpreter and to a user device, an interpretation report comprising the preview data,
   verifying, by the well log interpreter, a compliance of the obtained well log data with specifications and manufacturer guidelines;
   verifying, by the well log interpreter, a compliance of interpreted data with interpretation guidelines and benchmarks,
   wherein the well operation includes a cement evaluation, the cement evaluation based on interpreting the well log data using the plurality of machine-learning models, and
   wherein the cement is disposed in the wellbore according to the cement evaluation.

2. The method of claim 1, wherein a convolutional neural network performs the cement evaluation by interpreting the image well data, and
   wherein a convolutional neural network performs the cement evaluation by interpreting the image well data.

3. The method of claim 1, further comprising:
   performing, by the well log interpreter, a predictive analysis of trends and predictions of the well log data; and
   performing, by the well log interpreter a prescriptive analysis of the well log data.

4. The method of claim 3, wherein the predictive and the prescriptive analysis identify and correct anomalies.

5. The method of claim 3, wherein the machine learning models enable solving classification and regression computations.

6. The method of claim 1, further comprising:
   performing, by the well log interpreter, a quantitative interpretation of the obtained raw well log data; and
   performing, by the well log interpreter, a qualitative interpretation of the obtained raw well log data.

7. The method of claim 6, wherein the quantitative interpretation includes analyzing discrete data and continuous data.

8. The method of claim 6, wherein the quicklook interpretation report includes instructions to replace equipment, repeat the automated interpretation, and change interpretation parameters.

9. A system, comprising:
   a logging system coupled to a plurality of logging tools;
   a drilling system coupled to the logging system; and
   a well log interpreter comprising a computer processor, wherein the well log interpreter is coupled to the logging system and the drilling system, the well log interpreter comprising functionality for:

obtaining seismic data regarding a geological region of interest;

obtaining well log data from a wellbore within the geological region of interest; and determining a plurality of machine-learning models corresponding to the well data based on a plurality of well data types;

determining, in real-time with obtaining the well log data from the plurality of logging tools, preview data regarding a well operation using the machine-learning models and the well log data;

transmitting, to a user device, an interpretation report comprising the preview data, verifying a compliance of the obtained well log data with specifications and manufacturer guidelines; and verifying a compliance of interpreted data with interpretation guidelines and benchmarks.

10. The system of claim 9, wherein the well operation includes a cement evaluation, the cement evaluation based on interpreting the well log data using the plurality of machine-learning models.

11. The system of claim 9, wherein a convolutional neural network performs the cement evaluation by interpreting the image well data, and wherein a convolutional neural network performs the cement evaluation by interpreting the image well data.

12. The system of claim 9, wherein quicklook interpretation module is further configured to:

perform a predictive analysis of trends and predictions of the well log data; and perform a prescriptive analysis of the well log data.

13. The system of claim 12, wherein the predictive and the prescriptive analysis identify and correct anomalies.

14. The system of claim 12, wherein the machine learning models enable solving classification and regression computations.

15. The system of claim 9, wherein quicklook interpretation module is further configured to:

perform a quantitative interpretation of the obtained raw well log data; and perform a qualitative interpretation of the obtained raw well log data.

16. The system of claim 15, wherein the quantitative interpretation includes analyzing discrete data and continuous data.

17. The system of claim 15, wherein the quicklook interpretation report includes instructions to replace equipment, repeat the automated interpretation, and change interpretation parameters.

* * * * *

UNITED STATES PATENT AND TRADEMARK OFFICE
CERTIFICATE OF CORRECTION

| | | |
|---|---|---|
| PATENT NO. | : 11,988,795 B2 | Page 1 of 1 |
| APPLICATION NO. | : 17/463122 | |
| DATED | : May 21, 2024 | |
| INVENTOR(S) | : Mohamed Larbi Zeghlache | |

It is certified that error appears in the above-identified patent and that said Letters Patent is hereby corrected as shown below:

On the Title Page

Item (12), the name "Zeghlache" should read -- Larbi Zeghlache --

Signed and Sealed this
Fourteenth Day of October, 2025

John A. Squires
*Director of the United States Patent and Trademark Office*